(12) United States Patent
Delamere et al.

(10) Patent No.: US 12,339,514 B2
(45) Date of Patent: Jun. 24, 2025

(54) SYSTEMS AND METHODS FOR ALIGNING IMAGING DEVICES

(71) Applicant: Sensors Unlimited, Inc., Princeton, NJ (US)

(72) Inventors: Michael W. Delamere, Pennington, NJ (US); Michael J. Evans, Yardley, PA (US); Krishna Linga, Plainsboro, NJ (US); John Liobe, Newton, NJ (US)

(73) Assignee: Sensors Unlimited, Inc., Princeton, NJ (US)

( * ) Notice: Subject to any disclaimer, the term of this patent is extended or adjusted under 35 U.S.C. 154(b) by 667 days.

(21) Appl. No.: 17/704,761

(22) Filed: Mar. 25, 2022

(65) Prior Publication Data
US 2023/0305259 A1   Sep. 28, 2023

(51) Int. Cl.
| | | |
|---|---|---|
| *G02B 7/00* | (2021.01) | |
| *G01B 11/27* | (2006.01) | |
| *G01M 11/02* | (2006.01) | |
| *H10F 39/00* | (2025.01) | |
| *H10H 20/824* | (2025.01) | |

(52) U.S. Cl.
CPC .............. *G02B 7/004* (2013.01); *G01B 11/27* (2013.01); *G01M 11/0207* (2013.01); *G01M 11/0221* (2013.01); *H10F 39/8023* (2025.01); *H10H 20/824* (2025.01)

(58) Field of Classification Search
CPC ........ G02B 7/004; G02B 27/62; G01B 11/27; G01M 11/0207; G01M 11/0221; H10F 39/8023; H10H 20/824; H04N 23/55; H04N 23/56; H04N 17/002
See application file for complete search history.

(56) References Cited

U.S. PATENT DOCUMENTS

| | | |
|---|---|---|
| 6,351,612 B1 | 2/2002 | Misawa |
| 9,088,705 B1* | 7/2015 | Tam ...................... H04N 23/55 |
| 10,578,724 B2 | 3/2020 | Droz et al. |
| 10,816,648 B2 | 10/2020 | Pennecot et al. |
| 2009/0225162 A1 | 9/2009 | Liu |
| 2015/0350497 A1 | 12/2015 | Gamadia et al. |
| 2018/0262662 A1* | 9/2018 | Iwaguchi ............... H04N 23/54 |
| 2022/0377315 A1* | 11/2022 | Wang ..................... G02B 7/003 |

FOREIGN PATENT DOCUMENTS

| | | |
|---|---|---|
| CN | 112904171 A | 6/2021 |
| WO | 2018005063 A1 | 1/2018 |

OTHER PUBLICATIONS

Extended European Search Report dated May 19, 2023, issued during the prosecution of European Patent Application No. EP 23164190.3, 5 pages.

* cited by examiner

*Primary Examiner* — Michael E Teitelbaum

(57) ABSTRACT

A system for aligning components of an imaging device includes an imaging device, and a test camera. The imaging device includes a lens and a focal plane array (FPA). The FPA defines an optical axis and includes at least two test elements configured and adapted to emit a light through the lens. The test camera is configured and adapted to be mounted to and pre-aligned with the lens of the imaging device to receive a light from the at least two test elements.

20 Claims, 3 Drawing Sheets

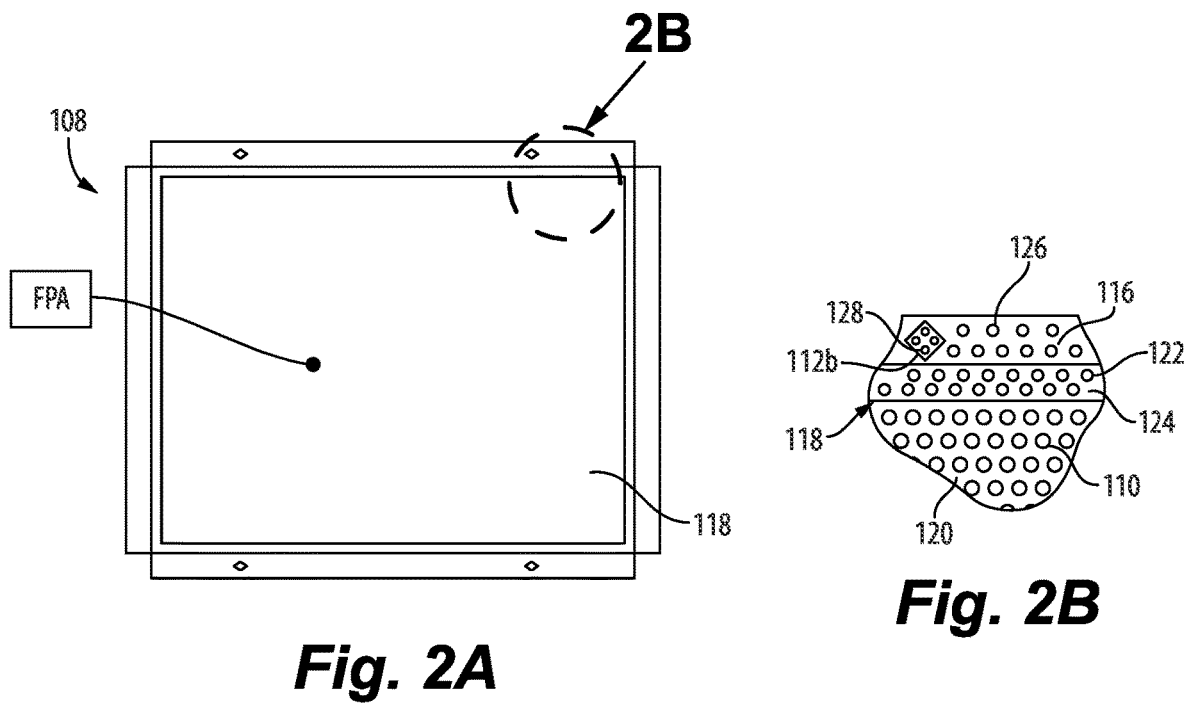
Fig. 2A
Fig. 2B
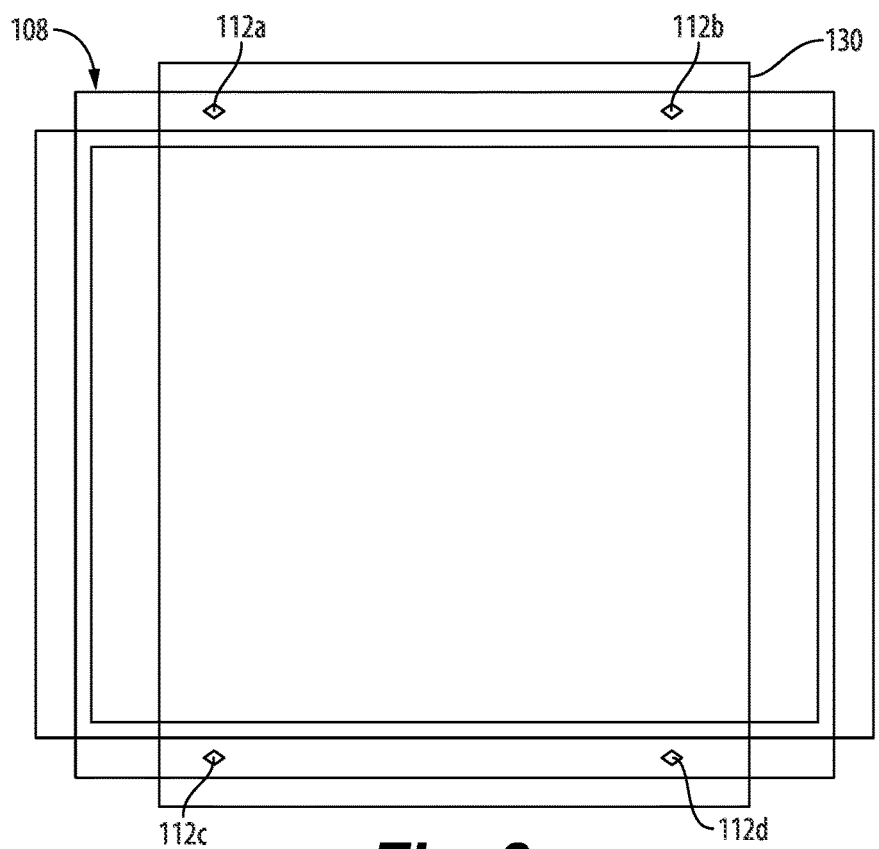
Fig. 3

SYSTEMS AND METHODS FOR ALIGNING IMAGING DEVICES

BACKGROUND OF THE INVENTION

1. Field of the Invention

The present disclosure relates to imaging devices, and more particularly to testing the alignment of components of the imaging devices.

2. Description of Related Art

In many camera applications, it is necessary to align the optical elements of the system lens with the center of the active area of the Focal Plane Array (FPA), also known as the optical axis. This typically requires specialized equipment in order to assure consistent mounting of the camera to the alignment test fixture, and then the imaging of a test card or other suitable pattern so that the optics positioning can be adjusted to bring the test image to the required location. Multiple individual items (camera, test card, and lens mount) must be well-controlled in order to achieve an accurate, repeatable alignment outcome. In addition, if different test fixtures are used, the outcome may vary due to physical differences (manufacturing tolerances etc.) between the fixtures.

The conventional techniques have been considered satisfactory for their intended purpose. However, there is a need for improved systems and methods for aligning components of an imaging device. This disclosure provides a solution for this need.

SUMMARY OF THE INVENTION

A system for aligning components of an imaging device includes an imaging device, and a test camera. The imaging device includes a lens and a focal plane array (FPA). The FPA defines an optical axis and includes at least two test elements configured and adapted to emit a light through the lens. The test camera is configured and adapted to be mounted to and pre-aligned with the lens of the imaging device to receive a light from the at least two test elements.

In accordance with some embodiments, the FPA includes imaging pixels defining a pixel area, guard pixels defining a guard pixel area positioned around a perimeter of the pixel area, and test pixels defining a test pixel area positioned around a perimeter of the guard pixel area. Each of the at least two test elements can include a cluster of forward biased diodes positioned in the test pixel area. Each of the at least two test elements can be configured and adapted to emit alignment reference light through the lens of the imaging device. The forward biased diodes of each cluster can be arranged in at least one of a square shape, a round shape, a diamond shape, and/or an "L" shape. The at least two test elements can include four test elements. The FPA can define a rectangular imaging area. The rectangular imaging area can be a square imaging area. The at least two test elements can be positioned proximate to respective corners of the rectangular imaging area. The at least two test elements can be positioned at respective mid-points of respective sides of the rectangular imaging area.

Two test elements can define an axis. Each test element can include a cluster of forward biased InGaAs diodes configured and adapted to emit alignment reference light through the lens of the imaging device. The at least two test elements can be configured and adapted to emit light in a wavelength ranging from 1650-1700 nm. The at least two additional test elements can be configured and adapted to emit light in a wavelength ranging from 1650-1700 nm, 100-400 nm, and/or 380-700 nm. Each cluster of forward biased diodes are configured and adapted to emit alignment reference light through the lens of the imaging device. The test elements can be forward biased InGaAs diodes configured and adapted to emit alignment reference light through the lens of the imaging device.

In accordance with another aspect, a method of testing and aligning a lens of an imaging device includes emitting light with at least two test elements positioned within a FPA of an imaging device. The FPA defines an optical axis. The method includes detecting the light with a test camera mounted to a lens of the imaging device to determine if the light emitted is in a desired position. The method includes adjusting the lens of the imaging device until the light emitted by these test features is detected by the test camera in the desired position.

The method can include mounting the test camera to the lens of the imaging device so that a test camera FPA is rotated ninety degrees relative to the FPA of the imaging device. The method can include mounting the test camera to the lens of the imaging device so that a test camera FPA is rotated forty five degrees relative to the FPA of the imaging device. Adjusting the lens of the imaging device can include at least one of moving the lens along a horizontal and/or a vertical axis, and/or rotation about the FPA. The method can include focusing the lens of the imaging device to infinity such that the light emitted from the at least two test elements will be collimated and rays emerging from the lens will be parallel to the optical axis. The method can include focusing a test camera lens to the at least two test elements.

These and other features of the systems and methods of the subject disclosure will become more readily apparent to those skilled in the art from the following detailed description of the preferred embodiments taken in conjunction with the drawings.

BRIEF DESCRIPTION OF THE DRAWINGS

So that those skilled in the art to which the subject disclosure appertains will readily understand how to make and use the devices and methods of the subject disclosure without undue experimentation, preferred embodiments thereof will be described in detail herein below with reference to certain figures, wherein:

FIG. 2A is a schematic top plan view of the FPA of the imaging device of FIG. 1, showing four test elements;

FIG. 2B is an enlarged schematic top plan view of the FPA of FIG. 2B, showing the pixel area and the guard pixel area;

FIG. 3 is a schematic top plan view of the FPA of the imaging device of FIG. 1, schematically showing the rotated overlay of the FPA of the test camera.

DETAILED DESCRIPTION OF THE PREFERRED EMBODIMENTS

Figure 1:
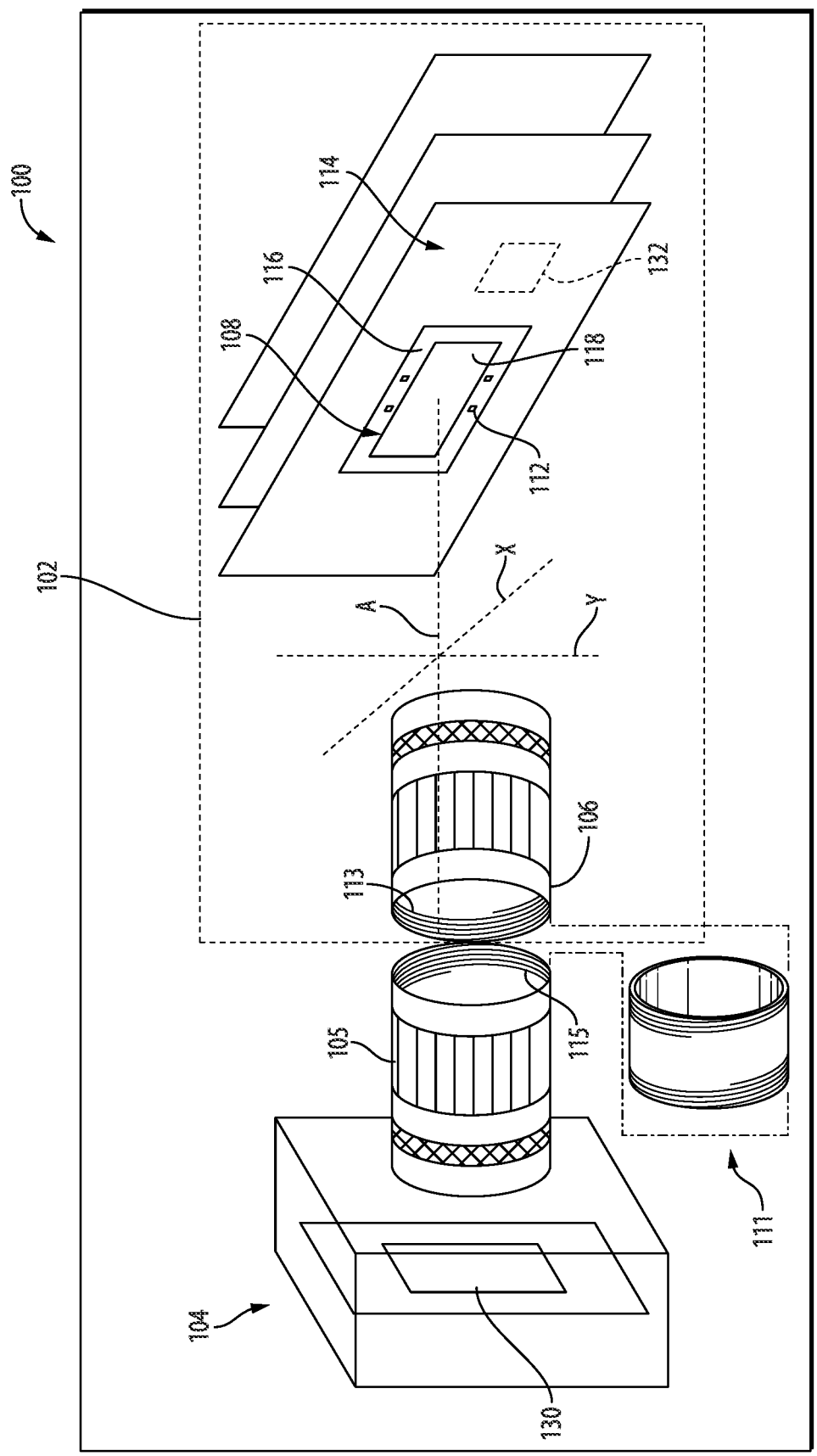
FIG. 1 is a schematic view of a system for aligning components of an imaging device constructed in accordance with an embodiment of the present disclosure, showing an imaging device having an FPA and a lens and a test camera.

Reference will now be made to the drawings wherein like reference numerals identify similar structural features or aspects of the subject disclosure. For purposes of explanation and illustration, and not limitation, a schematic view of an exemplary embodiment of the system for aligning components of an imaging device in accordance with the disclosure is shown in FIG. 1 and is designated generally by reference character 100. Other embodiments of the system for aligning components of an imaging device in accordance with the disclosure, or aspects thereof, are provided in FIGS. 2A-4, as will be described. The systems and methods described herein can be used to simplify the testing process for imaging devices by using test features on the FPA of the imaging device itself as the source of the test image, instead of a traditional test card. This eliminates the test card and its associated alignment process.

As shown in FIG. 1, a system 100 for aligning components of an imaging device 102 includes imaging device 102, and a test camera 104. Imaging device 102 includes a lens 106 and a focal plane array (FPA) 108. FPA 108 defines an optical axis A and four test elements 112a-112d configured and adapted to emit a light through lens 106. In the embodiment of FIG. 1, the wavelength of the emission from test elements 112a-112d is at an upper end of the SWIR (short-wave infrared) spectrum, ranging from about 1650-1700 nm. Test elements 112a-112d can be forward biased InGaAs diodes. Test camera 104 is configured and adapted to be mounted to and pre-aligned with lens 106 of imaging device 102 to receive a light from test elements 112a-112d. Test camera 104 includes a test camera lens 105. Because test camera 104 mounts directly to lens 106, the position of test camera 104 is not independent (as the test card was) and therefore it is, in essence, pre-aligned. This pre-alignment results in a more accurate alignment of lens 106, a simpler set up and faster alignment process, all of which result in reduced cost due to reduced labor hours needed to align lens 106 with the optical axis A.

With continued reference to FIG. 1, a variety of mechanical attachment devices can be used, for example existing alignment test fixtures. Those skilled in the art will readily appreciate that there are a variety of commercially available lenses equipped with a cylindrical threaded receptacle used to mount filters or other optical elements. In the embodiment of FIG. 1, a threaded adaptor 111 is configured and adapted to thread into threads 113 on lens 106 and threads 115 of test camera lens 105, thereby attaching the test camera 104 to imaging device 102. Alternatively, if the lens 106 is of custom design, said design may incorporate suitable mounting or alignment details (threaded adapters similar to above, pegs/locating holes, mechanical guides etc.) which will serve to affix the test camera 104 to lens 106. Test camera 104 will respond to the light emitted by test elements 112a-112d, and their relative positions can therefore be determined by test camera 104. Lens 106 alignment is achieved by adjusting the position of lens 106 until the detected positions of the test features 112a-112d matches the desired (pre-calculated) positions expected to be seen by test camera 104. Embodiments of the present disclosure can be used to eliminate offsets in both the horizontal axis X (schematically shown to be extending in and out of the page in FIG. 1) direction and the vertical axis Y direction (shown perpendicular to horizontal axis X), as well as rotation about the FPA optical axis A.

With continued reference to FIG. 1, FPA 108 is positioned on a printed circuit board assembly (PCBA) 114 of imaging device 102. Test elements 112a-112d are electrically coupled to control circuitry 132 positioned on the PCBA 114 to drive the light emission. Control circuitry 132 can be positioned in a variety of suitable places, such as off-chip, meaning it does not need to be incorporated into the PCBA or readout integrated circuit (ROIC). These test elements 112a-112d are positioned within FPA diode arrays 116. These FPA diode arrays 116 typically surround a rectangular imaging area 118, where rectangular includes a square shape. Diode arrays 116 around the imaging area 118 are generally used to test for dark current and other parameters to ensure FPA 108 meets specifications. In testing for dark current and/or other parameters (and in normal operation of the imaging area 118 of the array), the diodes of diode array 116 of the present disclosure are reverse biased. In embodiments of the present disclosure, test elements 112a-112d are forward biased diodes such that they will emit light in the same manner as a standard light-emitting diode (LED).

As shown in FIGS. 2A-2B, the imaging area 118 of FPA 108 includes imaging pixels 110 defining a pixel area 120, and guard pixels 122 defining a guard pixel area 124 positioned around a perimeter of the pixel area 120. Guard pixels 122 are contiguous with the imaging pixels 110 and extend out for several rows and columns along each edge. Guard pixels 122 act to mitigate any 'edge effects' that might occur at the periphery of pixel area 120. Test diode array 116 includes test diodes 126 positioned around a perimeter of guard pixel area 124. Test diodes 126 are located just beyond guard pixels 122 and act to check dark current, as described above. Each test element 112a-112d includes a cluster of forward biased diodes 128 (which are test diodes 126 in a forward biased position) positioned in the test diode array 116 (test element 112b is shown in FIG. 2B and test elements 112a, 112c and 112d are all similar). In accordance with the embodiment of FIGS. 2A-2B, test diodes 126 are fabricated from InGaAs and when forward biased, like forward biased diodes 128, they will emit SWIR light in the same manner of a standard LED. Those skilled in the art will readily appreciate that a variety of light-emitting diodes may be used for to make up suitable test elements 112a-112d and that a variety of wavelengths can be emitted. It is contemplated that light with other wavelengths in the electromagnetic spectrum can also be emitted by test elements 112a-112d, such as, visible light (380-700 nm), UltraViolet light (100-400 nm), and the like. Those skilled in the art will readily appreciate that as long as test diodes 126 are capable of emitting light when they are forward biased, they will provide suitable diodes to make up test elements 112a-112d. By forward-biasing already existing test diodes 126 in test diode array 116, the forward biased diodes 128 that make up test elements 112a-112d are allowed to be fabricated on the detector material as part of the existing processing—so the test elements 112a-112d incur no additional cost. Forward biased diodes 128 are configured and adapted to emit alignment reference light through lens 106 of imaging device 102. Forward biased diodes 128 of test element 112b are shown arranged in a diamond shape, but those skilled in the art will readily appreciate that a variety of suitable shapes may be used, such as a square shape, a round shape, and/or an "L" shape.

With reference to FIG. 3, it is contemplated that only two of test elements 112a-112d may be needed to provide proper alignment, e.g. test elements 112a and 112b. Two test elements 112b and 112c are positioned adjacent to opposite corners of FPA 108. In this way, in some embodiments of the invention, only two of test elements 112a-112d may be needed to provide proper alignment of lens 106. Those skilled in the art will readily appreciate that the two elements used could be test elements 112a and 112c, or 112a and 112d. The test camera 104 is set up so that a test camera FPA 130, shown in FIG. 1, is rotated 90° from FPA 108. FIG. 3 schematically shows the area of the test camera FPA 130 overlaid on the FPA 108. The rotation of test camera 104 allows for test elements 112a-112d to fall within an imaging area of FPA 130 of test camera 104 so that the position of the test elements 112a-112d can be determined. In general, test elements 112a-112d should be close to the edges of FPA 108 so they can be as far apart as possible (while still falling within the detecting area of FPA 130 of test camera 104. Having test elements 112a-112d as far apart as possible, while still falling within the detecting area of FPA 130, provides for the best possible accuracy in measurement, as any measurement error will result in smallest angular distortion.

Figure 4:
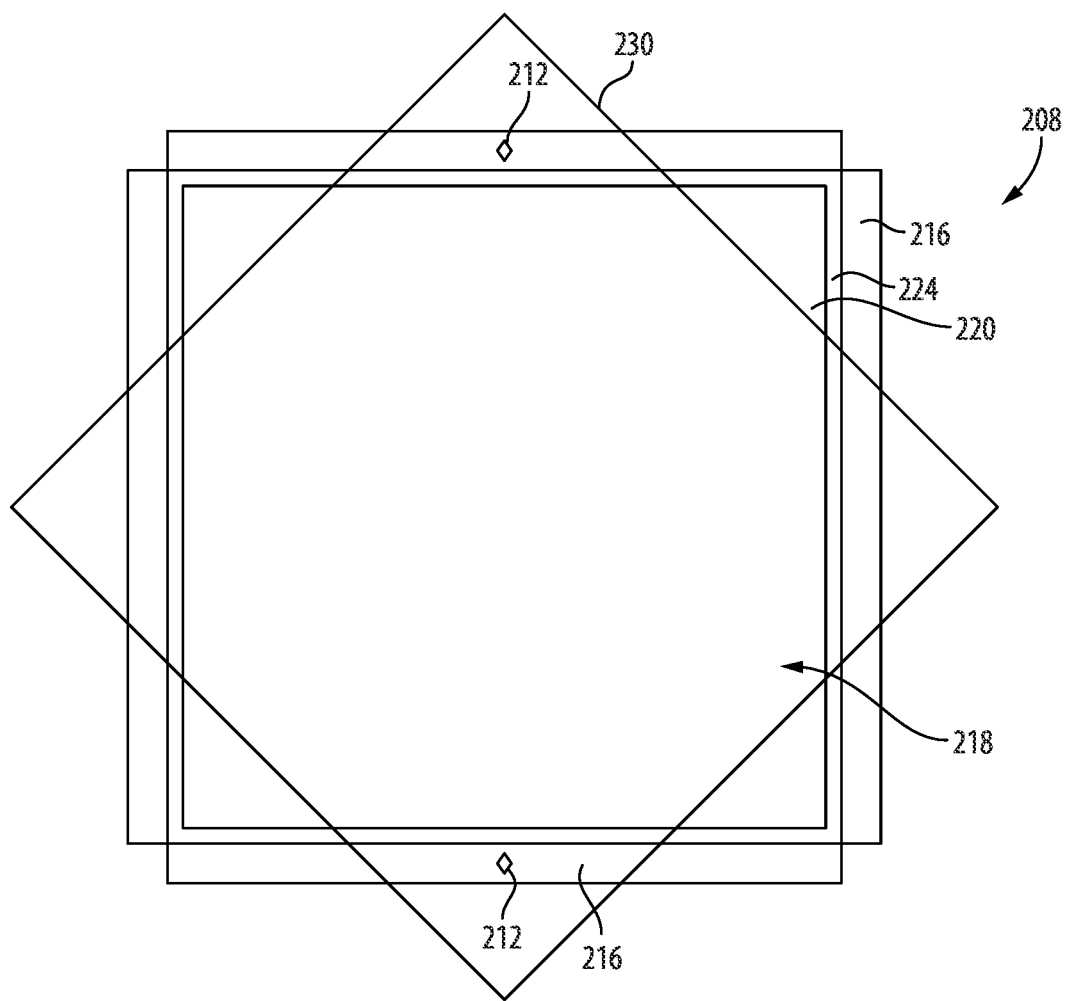
FIG. 4 is a schematic top plan view of another embodiment of an FPA constructed in accordance with an embodiment of the present disclosure, schematically showing the rotated overlay of the FPA of the test camera.

As shown in FIG. 4, another embodiment of an FPA 208 for use in imaging device 102 of system 100 is shown. FPA 208 is the same as FPA 108 except that FPA 208 has a square shape where two test elements 212 are positioned at the midpoints of respective edges, instead of being toward the corners of FPA 208. FPA 208 includes an imaging area 218, similar to imaging area 118. Imaging area 218 defines a pixel area 220 and a guard pixel area 224, which are the same as pixel area 120 and guard pixel area 124, except for the square shape. Test elements 212 are positioned within a test diode array 216. Test diode array 216 is the same as test diode array 116, except that the four edges of test diode array 216 are the same length and test elements 212 are positioned at the mid-points of respective edges. Each test element 212 includes a cluster of forward biased diodes and is positioned in the test diode array 216. By having each test element 212 positioned at the mid-point of a respective edge, a square test camera FPA 230 can be rotated 45 degrees relative to the edges of FPA 208 or a rectangle test camera FPA 130 can be rotated 45 degrees relative to the edges of FPA 208 and the test elements 212 will fall within the imaging area of the test camera defined by the test camera FPA 230. Test camera FPA 230 can be used in test camera 204. Those skilled in the art will readily appreciate that if the original FPA is square, such as FPA 208, and the test camera has a square test camera FPA 230, the test camera should be rotated. Those skilled in the art will appreciate that you can use any test camera with a given FPA shape, as long as in the un-aligned state, the test features will be within the imaging area defined by the FPA of the test camera.

In accordance with another aspect, a method of testing and aligning a lens, e.g., lens 106, of an imaging device, e.g., imaging device 102, includes mounting a test camera, e.g. the test camera 104, to the lens of the imaging device so that a test camera FPA, e.g. FPA 130, is rotated ninety degrees relative to an FPA, e.g. FPA 108, of the imaging device. Mounting the test camera to the lens of the imaging device includes mounting a first side of a threaded adaptor, e.g. threaded adaptor 111, to the lens of the imaging device and then mounting the test camera lens to a second side of the threaded adaptor. Where a square FPA, e.g. square FPA 208, is used, those skilled in the art will readily appreciate that mounting the test camera to the lens of the imaging device includes mounting the test camera such that a test camera FPA, e.g. test camera FPA 130, is rotated at 45 degrees relative to the square FPA.

The method includes emitting light with at least two test elements, e.g., test elements 112a-112d, or 212, positioned within a diode array, e.g. diode array 116 or 216, of the FPA of the imaging device. The FPA defines an optical axis, e.g., optical axis A. The method includes focusing the lens of the imaging device to infinity such that the light emitted from the test elements will be collimated and rays emerging from the lens will be parallel to the optical axis. The method includes focusing a test camera lens, e.g., test camera lens 105, to the test elements. The focus of the lens should be adjusted for sharpest detail on the test elements. The method includes detecting the light with the test camera mounted to the lens of the imaging device to determine if the light emitted is in a desired position. To determine this, the test camera will respond to the light emitted by the test elements (e.g. the SWIR light), and their relative positions can therefore be determined.

The method includes adjusting the lens of the imaging device until the light emitted by these test features is detected by the test camera in the desired position. The lens alignment is achieved by adjusting the position of the lens until the detected positions of the test elements matches the desired (pre-calculated) positions. Adjusting the lens of the imaging device includes moving the lens along a horizontal and/or a vertical axis, e.g., horizontal axis X and vertical axis Y, and/or rotation about the FPA about optical axis A. This method can be used to eliminate offsets in both horizontal and vertical axes, as well as rotation about the optical axis. Embodiments of the present disclosure include manufacturing and/or retrofitting a Readout Integrated Circuit (ROIC) or Photodiode Array (PDA) to include metallization to allow the test elements to be operated in LED mode.

Embodiments of system 100 provide for more accurate alignment as compared with the traditional test card approach, simpler set-up, and quicker test procedures. The faster set-up and quicker test procedure results in reduced labor hours and costs savings. The simpler set up stems from not having to align a test card with the FPA optical axis A. Instead, the test camera 104 and lens 105 attach directly to the lens 106 to be aligned. The faster alignment process results from the four, widely-separated test elements as the references, misalignment is magnified to the greatest extent possible, and the operator can see the effects of the alignment adjustment in real time.

The methods and systems of the present disclosure, as described above and shown in the drawings, provide for systems and methods for aligning components of an imaging device with superior properties including simpler set-up, faster alignment process and lower cost. The systems and methods of the present invention can apply to a variety of imaging devices, or the like. While the apparatus and methods of the subject disclosure have been shown and described with reference to preferred embodiments, those skilled in the art will readily appreciate that changes and/or modifications may be made thereto without departing from the scope of the subject disclosure.

What is claimed is:

1. A system for aligning components of an imaging device, the system comprising:
    an imaging device including a lens and a focal plane array (FPA), wherein the FPA defines an optical axis and includes at least two test elements configured and adapted to emit a light through the lens; and
    a test camera configured and adapted to be mounted to and pre-aligned with the lens of the imaging device to receive a light from the at least two test elements.

2. The system as recited in claim 1, wherein the FPA includes imaging pixels defining a pixel area, guard pixels defining a guard pixel area positioned around a perimeter of the pixel area, and test pixels defining a test pixel area positioned around a perimeter of the guard pixel area.

3. The system as recited in claim 2, wherein each of the at least two test elements includes a cluster of forward biased diodes positioned in the test pixel area, wherein each of the at least two test elements is configured and adapted to emit alignment reference light through the lens of the imaging device.

4. The system as recited in claim 3, wherein the forward biased diodes of each cluster are arranged in at least one of a square shape, a round shape, a diamond shape, and/or an "L" shape.

5. The system as recited in claim 1, wherein each test element includes a cluster of forward biased InGaAs diodes configured and adapted to emit alignment reference light through the lens of the imaging device.

6. The system as recited in claim 1, wherein the at least two test elements are configured and adapted to emit light in a wavelength ranging from 1650-1700 nm.

7. The system as recited in claim 1, wherein the at least two test elements are configured and adapted to emit light in a wavelength ranging from 100-400 nm.

8. The system as recited in claim 1, wherein the at least two test elements are configured and adapted to emit light in a wavelength ranging from 380-700 nm.

9. The system as recited in claim 1, wherein each test element includes a cluster of forward biased diodes configured and adapted to emit alignment reference light through the lens of the imaging device.

10. The system as recited in claim 1, wherein the at least two test elements are forward biased InGaAs diodes configured and adapted to emit alignment reference light through the lens of the imaging device.

11. The system as recited in claim 1, wherein the at least two test elements include four test elements.

12. The system as recited in claim 1, wherein the FPA defines a rectangular imaging area wherein the at least two test elements are positioned proximate to respective corners of the rectangular imaging area.

13. The system as recited in claim 1, wherein the FPA defines a rectangular imaging area wherein the at least two test elements are positioned at respective mid-points of respective sides of the rectangular imaging area.

14. The system as recited in claim 1, wherein the FPA defines a square imaging area.

15. A method of testing and aligning a lens of an imaging device, the method comprising:
    emitting light with at least two test elements positioned within a focal plane array (FPA) of an imaging device, wherein the FPA defines an optical axis;
    detecting the light with a test camera mounted to a lens of the imaging device to determine if the light emitted is in a desired position; and
    adjusting the lens of the imaging device until the light emitted by the at least two test elements is detected by the test camera in the desired position.

16. The method as recited in claim 15, further comprising mounting the test camera to the lens of the imaging device so that a test camera FPA is rotated ninety degrees relative to the FPA of the imaging device.

17. The method as recited in claim 15, further comprising mounting the test camera to the lens of the imaging device so that a test camera FPA is rotated forty five degrees relative to the FPA of the imaging device.

18. The method as recited in claim 15, wherein adjusting the lens of the imaging device includes at least one of moving the lens along a horizontal and/or a vertical axis, and/or rotation about the FPA.

19. The method as recited in claim 15, further comprising focusing the lens of the imaging device to infinity such that the light emitted from the at least two test elements will be collimated and rays emerging from the lens will be parallel to the optical axis.

20. The method as recited in claim 15, further comprising focusing a test camera lens to the at least two test elements.

* * * * *